(12) United States Patent
Thakker et al.

(10) Patent No.: US 8,089,314 B2
(45) Date of Patent: Jan. 3, 2012

(54) OPERATIONAL AMPLIFIER HAVING IMPROVED SLEW RATE

(75) Inventors: Rajesh A. Thakker, Gujarat (IN);
Mayank Shrivastava, Maharashtra (IN);
Maryam Shojaei Baghini, Maharashtra (IN); Dinesh Kumar Sharma, Maharashtra (IN); Ramgopal V. Rao, Maharashtra (IN); Mahesh B. Patil, Maharashtra (IN)

(73) Assignee: Indian Institute of Technology-Bombay (IN)

( * ) Notice: Subject to any disclaimer, the term of this patent is extended or adjusted under 35 U.S.C. 154(b) by 0 days.

(21) Appl. No.: 12/764,294

(22) Filed: Apr. 21, 2010

(65) Prior Publication Data
US 2011/0215868 A1  Sep. 8, 2011

(30) Foreign Application Priority Data

Mar. 2, 2010  (IN) ............................. 542/MUM/2010

(51) Int. Cl.
*H03F 3/45* (2006.01)
(52) U.S. Cl. ....................................................... 330/253
(58) Field of Classification Search ........... 330/252–261
See application file for complete search history.

(56) References Cited

U.S. PATENT DOCUMENTS

| | | | |
|---|---|---|---|
| 6,529,048 B2 | 3/2003 | Zanchi | |
| 7,342,450 B2 * | 3/2008 | Jones | 330/253 |
| 7,436,261 B2 * | 10/2008 | Kazuyoshi | 330/253 |
| 7,446,606 B2 | 11/2008 | Zhang et al. | |
| 7,863,982 B2 * | 1/2011 | Chen et al. | 330/261 |

OTHER PUBLICATIONS

Kurkure, G., et al., "A Novel Adaptive Biasing Scheme for CMOS Op-Amps," Journal of Semiconducor Technology and Science, vol. 5, No. 3, Sep. 2005.
Lopez-Martin, A., et al., "Low-Voltage Super Class AB CMOS OTA Cells with Very High Slew Rate and Power Efficiency," IEEE Journal of Solid-State Circuits, vol. 40, No. 5, May 2005.
Patil, M. B., "A New Public-Domain Program for Mixed-Signal Simulation," IEEE Transactions on Education, vol. 45, No. 2, May 2002.
Perez, A., et al., "Slew-Rate and Gain Enhancement in Two Stage Operational Amplifiers," IEEE International Symposium on Circuits and Systems, 2009. ISCAS 2009.
Shin, S., et al., "A Slew Rate Controlled Output Driver Using PLL as Compensation Circuit," IEEE Journal of Solid-State Circuits, vol. 38, No. 7, Jul. 2003.
Subramaniam, P.C., et al., "High Slew-Rate CMOS Operational Amplifier," Electronics Letters, Apr. 17, 2003, vol. 39, No. 8.

(Continued)

*Primary Examiner* — Hieu Nguyen
(74) *Attorney, Agent, or Firm* — McDonnell Boehnen Hulbrert & Berghoff LLP

(57) ABSTRACT

A slew rate improved operational amplifier circuit is provided to improve the slew rates of an operational amplifier with minimal sacrifices in power dissipation and other operational amplifier parameters. To improve the slew rates of operational amplifiers, additional current sources are activated when a slewing operation is detected. The detection of slewing operations and the activation of current sources upon detection can be implemented using two comparator circuits—one for a positive slewing operation, and one for a negative slewing operation. A sub-45 nm FinFET implementation of this slew rate improvement concept was implemented and compared against slew rate optimized individual two-stage operational amplifiers. Simulations show that slew rates were significantly improved by the implementation of the comparator circuits (5590 V/μs vs. 273 V/μs), with minimal increases in power dissipation (78 μW vs. 46 μW).

20 Claims, 3 Drawing Sheets

OTHER PUBLICATIONS

Thakker, R., et al., "A Novel Table-Based Approach for Design of FinFET Circuits," IEEE Transactions on Computer-Aided Design of Integrated Circuits and Systems, vol. 28, No. 7, Jul. 2009.

Thakker, R., et al., "Automated Design and Optimization of Circuits in Emerging Technologies," in proceedings of 14th ASP-DAC, pp. 504-509, Jan. 2009.

van Dal, M.J.H., et al., "Highly Manufacturable FinFETs with sub-10nm fin width and high aspect ratio fabricated with immersion lithography," IEEE 2007 Symposium on VLSI Technology Digest of Technical Papers, pp. 110-111, Jun. 12-14, 2007.

International Search Report for PCT Pat. App. No. PCT/IB2010/002923, mailed Apr. 27, 2011.

Written Opinion of the International Searching Authority for PCT Pat. App. No. PCT/IB2010/002923, mailed Apr. 27, 2011.

\* cited by examiner

OPERATIONAL AMPLIFIER HAVING IMPROVED SLEW RATE

CROSS REFERENCE TO RELATED APPLICATIONS

This application claims priority to Indian Patent Application Serial No. 542/MUM/2010 filed Mar. 2, 2010, the contents of which are incorporated by reference herein in its entirety.

BACKGROUND

A common two-stage operational amplifier includes an input stage and a second stage. The input stage is usually a differential amplifier with a transconductance characteristic, producing an output current from the differential voltage inputs. Transconductance is typically very high, and thus a fairly small input voltage may be sufficient to cause the input stage to saturate, and accordingly produce a constant current output.

The current output from the input stage is received by the second stage, where frequency compensation is accomplished. The low pass characteristic of this stage approximates an integrator, and a current input which can therefore produce a linearly increasing output if current input is constant. The input current to the second stage along with the compensation capacitance and gain-bandwidth of the amplifier all affect the slew rate of the two-stage operational amplifier.

The slew rate of an amplifier represents the maximum rate of change of a signal at any point in the circuit. In other words, limitations in slew rates may result in non-linear effects that may significantly distort amplifier output if the input signal is at a frequency exceeding the slew rate limitations of the amplifier. As such, the frequency of the input signal is often limited by the capabilities of an amplifier during circuit design.

SUMMARY

In an example, an operational amplifier circuit having improved slew rate is provided. The operational amplifier circuit includes an operational amplifier receiving a first voltage input and a second voltage input. The operational amplifier circuit further includes a current booster circuit comprising a first current source, a second current source, a third current source, and a fourth current source. The operational amplifier circuit also includes a first comparator having a non-inverting input, an inverting input and an output, the non-inverting input coupled to the first voltage input and the inverting input coupled to the second voltage input; and a second comparator having a non-inverting input, an inverting input and an output, the non-inverting input coupled to the second voltage input and the inverting input coupled to the first voltage input. The outputs of the first and second comparators control the first, second, third and fourth current sources to supply additional current improving the slew rate of the operational amplifier circuit.

In another example, the first comparator and the second comparator of the circuit are implemented with transistors having different dimensions. The different dimensions may be different channel lengths. In addition, the first comparator detects the onset of a positive slewing operation, and the second comparator detects the onset of a negative slewing operation, such that the first and third current sources are activated when the onset of a positive slewing operation is detected by the first comparator, and the second and fourth current sources are activated when the onset of a negative slewing operation is detected by the second comparator. Further, the onset of a positive slewing operation is detected when the difference between the first voltage input and the second voltage input is a positive value greater than a threshold voltage, and the onset of a negative slewing operation is detected when the difference between the first voltage input and the second voltage input is a negative value having an absolute value greater than a threshold voltage. The comparators of the operational amplifier may further be implemented using Fin Field Effect Transistor (FinFET) devices.

In an example, a method for improving a slew rate of an operational amplifier is also provided. The method includes detecting the onset of a slewing operation, activating additional current sources during the slewing operation to improve the slew rate, deactivating the additional current sources when no slewing operation is detected, thereby minimizing additional power dissipation from additional current flow. In addition, detecting the onset of a slewing operation may further comprise comparing the difference between a first voltage and a second voltage at the input of the operational amplifier against the switching threshold voltages of one or more comparators. In one example, the additional current sources of the operational amplifier are activated depend on whether the detected slewing operation is positive or negative. The slewing operation may be positive if the difference between the input voltages is positive and greater than the switching threshold voltages of the one or more comparators, and the slewing operation may be negative if the difference between the input voltages is negative and the absolute value of the difference is greater than the switching threshold voltages of the one or more comparators.

In another example, the two input transistors of the one or more comparators for improving slew rate have different dimensions. The different dimensions may include different channel lengths. In addition, the first comparator and the second comparator may be implemented using FinFET devices.

In another example, a slew rate improvement circuit for an operational amplifier is provided. The slew rate improvement circuit includes a current booster circuit comprising a first current source, a second current source, a third current source, and a fourth current source, and a comparator circuit comprising a first comparator and a second comparator, wherein the first comparator has a non-inverting input, an inverting input and an output, the non-inverting input coupled to a first voltage input and the inverting input coupled to a second voltage input, wherein the second comparator has a non-inverting input, an inverting input and an output, the non-inverting input coupled to the second voltage input and the inverting input coupled to the first voltage input; wherein the outputs of the first and second comparators control the first, second, third and fourth current sources to supply additional current improving the slew rate of the operational amplifier circuit. The first voltage input and the second voltage input may further be voltage inputs to the operational amplifier.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The embodiments will be further elucidated by means of the following description and the appended drawings.

DETAILED DESCRIPTION

Figure 1:
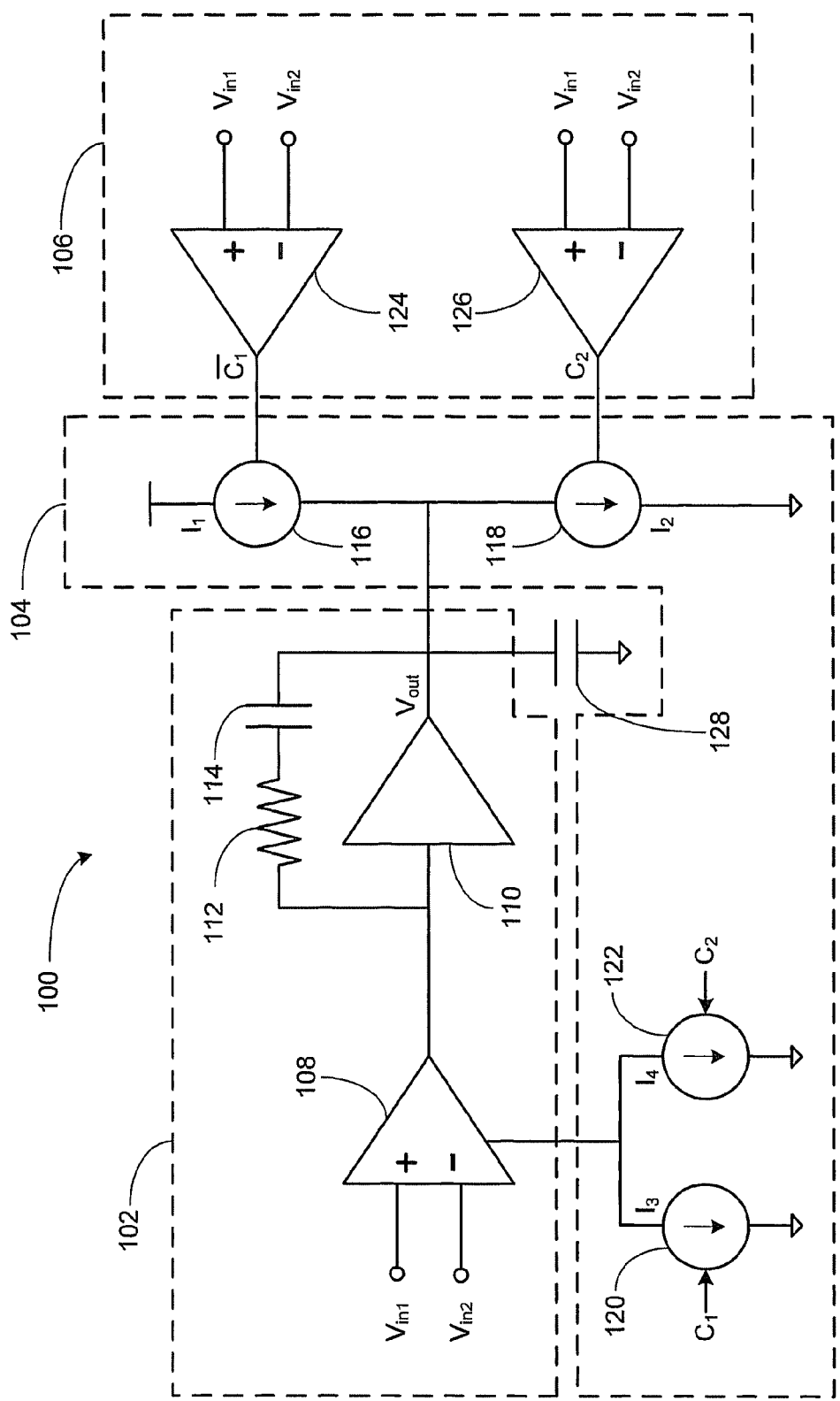
FIG. 1 is an illustrative circuit diagram of an operational amplifier circuit having improved slew rate.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

The present application provides an operational amplifier circuit having a high slew rate while maintaining a low power overhead and basic performance measures. In an embodiment, the principle behind the operation of the circuit relies on detecting the onset of a slewing operation of the circuit and accordingly activating additional current sources. Because the additional current sources are only activated during the slewing operation of the circuit, power dissipation and other performance measures of the operational amplifier circuit remain unchanged.

FIG. 1 is an illustrative circuit diagram of an embodiment of an operational amplifier circuit 100 having improved slew rate. The operational amplifier circuit 100 comprises a two-stage operational amplifier circuit 102, additional current sources 104 and a comparator circuit 106. The two-stage operational amplifier circuit 102 comprises a first amplifier 108 and a second amplifier 110 connected in series, wherein the first amplifier 108 receives voltage inputs $V_{in1}$ and $V_{in2}$, and the second amplifier 110 outputs a voltage $V_{out}$. A resistor 112 in series with a compensator capacitor 114 are coupled in parallel to the second amplifier. The output end of the two-stage operational amplifier circuit 102 is coupled to a load capacitor 128.

The comparator circuit 106 comprises a first comparator 124 and a second comparator 126, both receiving the voltage inputs $V_{in1}$ and $V_{in2}$ and having a first comparator output $C_1$ and a second comparator output $C_2$, respectively. The additional current sources 104 comprises a first current source 116, a second current source 118, a third current source 120 and a fourth current source 122. The first current source 116 and third current source 120 are controlled according to the first comparator output $C_1$, while the second current source 118 and the fourth current source 122 are controlled according to the second comparator output $C_2$. The first current source 116 and the second current source 118 are coupled to the output of the two-stage operational amplifier circuit 102, while the third current source 120 and the fourth current source 122 are coupled to the power source of the first amplifier 108 of operational amplifier 102.

As shown in FIG. 1, the additional current sources 104 and the comparator circuit 106 are circuit additions that can be used to improve the slew rate of the two-stage operational amplifier circuit 102. The additional current sources 104 is effectively a current boosting module for the two-stage operational amplifier circuit 102, and the comparator circuit 106 is effectively a detection circuit for detecting the onset of slewing.

As shown in FIG. 1, the first comparator 124 and the second comparator 126 are asymmetrical. Asymmetrical comparators have asymmetrical input differential stages, which results in an artificial input offset voltage that is the differential switching threshold voltage of the comparator. Such asymmetrical input differential stages can be implemented by using either differently sized comparator input transistors, or differently sized comparator input stage load transistors. In an embodiment of the present application, the first comparator 124 and second comparator 126 are implemented with input transistors of different channel lengths. The comparators 124 and 126 may further be designed to keep the output of the control logic circuit at a proper logic level (i.e. logic "High" or logic "Low" depending on the polarity of four additional current sources 116, 118, 120, 122) when the absolute value of the difference between voltage inputs $V_{in1}$ and $V_{in2}$ is less than a threshold value V. In the case of the present embodiment, when no slewing onset is detected, the outputs of the first comparator 124 and the second comparator 126 are either at $V_{DD}$ when controlling P-FinFET current sources or at ground when controlling N-FinFET current sources.

As described above, the first current source 116 and the third current source 120 are controlled by the first comparator 124, and the second current source 119 and the fourth current source 122 are controlled by the second comparator 126. The first current source 116 and the third current source 120 may be approximately equal in current value, while the second current source 118 and the fourth current source 122 may also be approximately equal in value.

Functionally, the first comparator 124 operates in a positive slewing mode when $V_{in1}$ is greater than $V_{in2}$ by some marginal value, while the second comparator 126 operates in a negative slewing mode when $V_{in1}$ is less than $V_{in2}$ by some marginal value. In the event that the difference between voltage inputs $V_{in1}$ and $V_{in2}$ exceeds a threshold voltage, such as $V_{sw}$, the inverted output of the first comparator, $\overline{C_1}$ becomes low, and the first current source 116 and the third current source 120 become activated. The activation of the first current source 116 provides additional current through the compensation capacitor 114, while the activation of the third current source 120 provides a path to discharge the opposite terminal of the compensation capacitor 114. As a result, the third current source 120 assists the first current source 116 in improving the positive slew rate of the circuit.

Analogously, when the onset of a negative slewing operation is detected (absolute value of difference between voltage inputs $V_{in1}$ and $V_{in2}$ exceeds the threshold voltage $V_{sw}$), the output of the second comparator $C_2$ becomes high. In this case, the second current source 118 and the fourth current source 122 are activated, and the negative slew rate is improved. In both cases, the threshold voltage $V_{sw}$ determines the switching point of the detector circuit and can be designed to adapt to different operational amplifier applications.

In one embodiment of the present application, the operational amplifier having improved slew rate is implemented using FinFET devices at 45 nm technology. The FinFET technology parameters used in this embodiment have a minimum channel length (L) of 20 nm, effective oxide thickness (EOT) of 0.9 nm, fin width (WFIN) of 6 nm, and fin height (HFIN) of 30 nm. The channel doping is $1\times10^{15}$ cm$^{-3}$ and the source/drain doping is $1\times10^{20}$ cm$^{-3}$ with an overlap distance (LOV) of 2 nm and a 1 nm/decade Gaussian doping gradient into the channel.

FIG. 2a is an illustrative circuit schematic 202 for a FinFET implementation of a two-stage operational amplifier; FIG. 2b is an illustrative circuit schematic 204 for a FinFET implementation of a first comparator with first and third current sources; FIG. 2c is an illustrative circuit schematic 206 for a FinFET implementation of a second comparator with second and fourth current sources. In the example embodiment shown in FIGS. 2a-2c, the numbers in the bracket indicate the number of fins for the respective FinFET device. Example values for capacitors and resistors are also provided.

As shown in FIG. 2a, the two-stage operational amplifier parameters are designed and optimized for the maximum slew rate under a given power constraint, and accordingly used for simulations to demonstrate slew rate improvement as a result of implementing the comparator and current booster circuits shown in FIGS. 2b and 2c.

Figure 2:
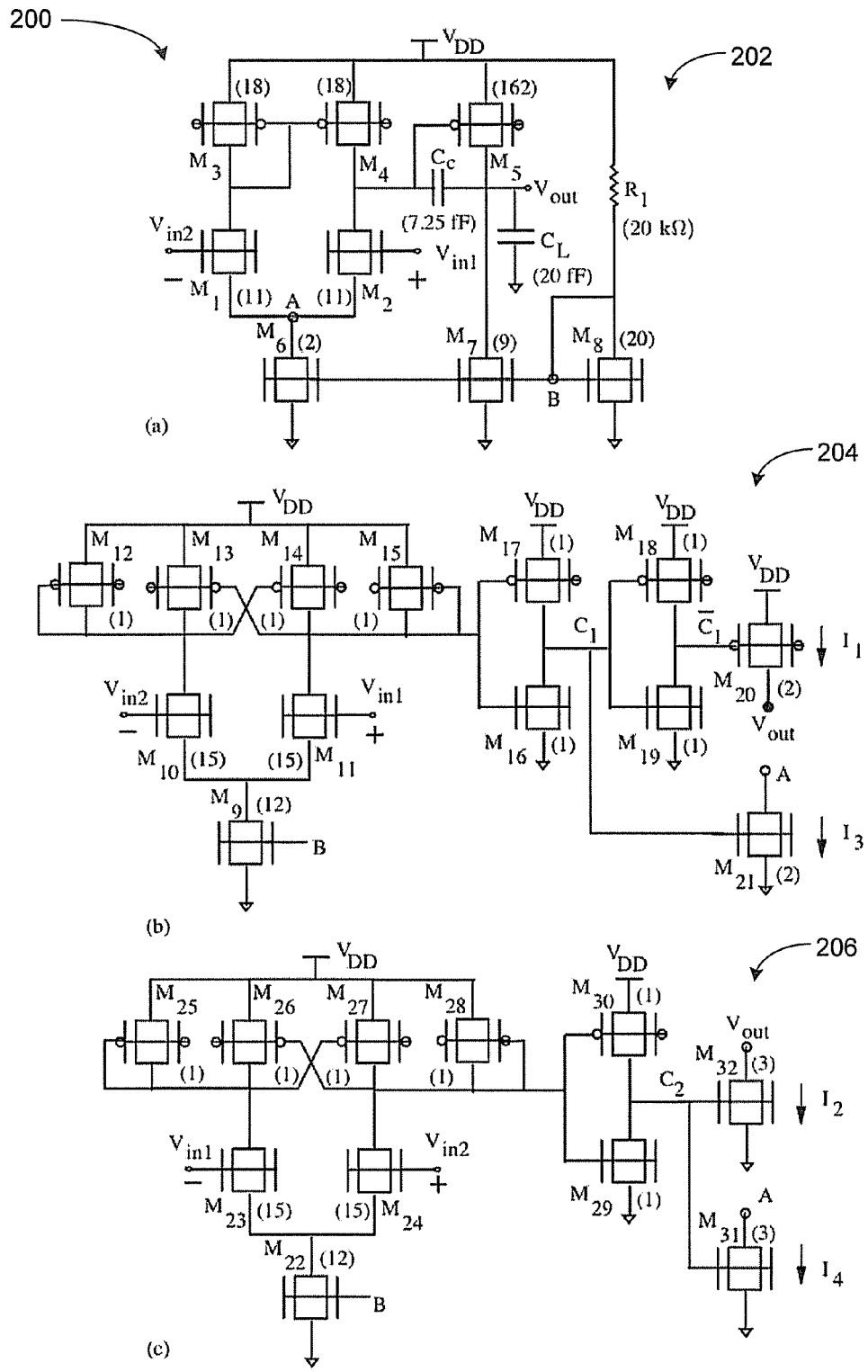
FIG. 2a is an illustrative circuit schematic for a FinFET implementation of a two-stage operational amplifier.
FIG. 2b is an illustrative circuit schematic for a FinFET implementation of a first comparator with first and third current sources.
FIG. 2c is an illustrative circuit schematic for a FinFET implementation of a second comparator with second and fourth current sources.

In the embodiment of FIG. 2, the operational amplifier circuit 202 is designed using FinFET devices of channel length 50 nm. In order to obtain the required threshold (switching voltage) $V_{sw}$, however, it is desirable to use asymmetric comparators by implementing asymmetric input devices. As discussed above, asymmetry in the comparator circuits 204 and 206 may be implemented in different, ways, such as by introducing mismatches between lengths or number of fingers of the two corresponding input transistors. In the example embodiment shown in FIG. 2, FinFET devices with different channel lengths are used in the input stage to achieve the required asymmetry.

In the first comparator circuit 204 of FIG. 2b, the input transistors M10 and M11 of the comparator in FIG. 2b have different channel lengths. The channel lengths of M10 and the other FinFET devices in the first comparator circuit 204 are 50 nm, while the input transistor M11 has a channel length of 100 nm. Similarly, the M23 and M24 transistors of the second comparator circuit 206 of FIG. 2c are of different channel lengths. The channel lengths of M23 and the other FinFET devices in the second comparator circuit 206 are 50 nm, while the input transistor M24 has a channel length of 100 nm.

As discussed above, demonstration of the slew rate improvement for an operational amplifier circuit begins with optimizing the parameters of the operational amplifier circuit 202 of FIG. 2a under given power constraints. The optimized parameters, as well as slew rate values are shown in Table 1. The slew rate values are measured for an input signal with rise and fall times of 100 ps. In the discussions below, this circuit is referred to as the "Two-Stage Op-Amp 1."

TABLE 1

|  | Desired Values | Best Obtained Values (Two-Stage Op-Amp 1) |
| --- | --- | --- |
| Gain | ≧80 dB | 79.65 dB |
| Phase Margin | ≧65° | 61° |
| Unity Gain Frequency | ≧500 MHz | 695 MHz |
| Power Dissipation | ≦50 μW | 46 μW |

TABLE 1-continued

|  | Desired Values | Best Obtained Values (Two-Stage Op-Amp 1) |
| --- | --- | --- |
| Offset Voltage | ≦50 μV | 83 μV |
| Slew Rate Rise | ≧500 V/μS | 273 V/μS |
| Slew Rate Fall | ≧500 V/μS | 271 V/μS |

After the parameters for the two-stage operational amplifier 202 have been optimized, the first and second comparator circuits 204 and 206 are designed. In this embodiment, the switching voltage $V_{sw}$ is set at 55 mV. Consistent with the discussions above, the input transistors of the comparator circuits 204 and 206 are asymmetrical. The number of fins for FinFET devices in the current source circuits of the comparator circuits 204 and 206 can also be tuned to provide the best settling time during slewing operations.

Once the parameters for the first and second comparator circuits 204 and 206 have been optimized, simulations were performed to compare the slew rate of the optimized two-stage operational amplifier circuit 202 individually, with the slew rate of the optimized two-stage operational amplifier circuit 202 in combination with the slew rate improving circuit comprising comparator circuits 204 and 206, current sources 116, 118, 120, 122 and control logic. In the discussions below, the combination of the Two-Stage Op-Amp 1 and the slew-rate improvement circuit is referred as the "SR-Improved Op-Amp." The results of the simulations are shown in Table 2.

TABLE 2

|  | Two-Stage Op-Amp 1 | SR-Improved Op-Amp |
| --- | --- | --- |
| Gain | 79.65 dB | 79.65 dB |
| Phase Margin | 61° | 61° |
| Unity Gain Frequency | 695 MHz | 695 MHz |
| Power Dissipation | 46 μW | 78 μW |
| Offset Voltage | 83 μV | 83 μV |
| Slew Rate Rise | 273 V/μS | 6171 V/μS |
| Slew Rate Fall | 271 V/μS | 5590 V/μS |

As shown in Table 2, the slew rate of the SR-Improved Op-Amp improved to 5590 V/μS from the slew rate of Two-Stage Op-Amp 1 of 271 V/μS, while the power dissipation increased from 46 μW to 78 μW, and other parameters remain the same. The increase in power dissipation is marginal in comparison to improvement observed in slew rates. It should also be noted that some of the increased power dissipation is from the comparator circuits 204 and 206.

Figure 3:
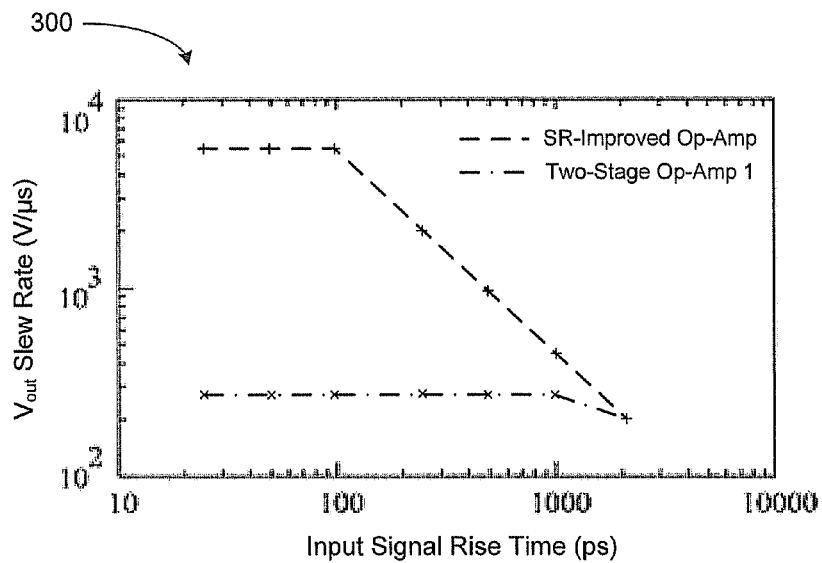
FIG. 3 is a graph comparing the slew rates of a two-stage operational amplifier and an operational amplifier circuit having improved slew rate embodiment of the present application.

FIG. 3 is a graph 300 comparing the slew rates of the Two-Stage Op-Amp 1 and the SR-Improved Op-Amp. The slew rates of the Two-Stage Op-Amp 1 and the SR-Improved Op-Amp are measured for an input signal having rise and fall times varying in the range of 25 ps to 2 ns. As shown, the slew rate of Two-Stage Op-Amp 1 is generally independent of input rise time. On the other hand, slew rate of the SR-Improved Op-Amp circuit increases significantly as the input signal rise time decreases, down to the range of 100 ps. As such, an operational amplifier circuit in combination with the slew rate improvement circuitry provided in an embodiment of the present application is capable of tracking input signals with rise/fall times as short as 100 ps.

To further demonstrate the slew rate improvements achieved through the comparator circuits 204 and 206, a second two-stage operational amplifier circuit was optimized for maximum slew rate, without any power constraints. The slew rate of this circuit, referred to as "Two-Stage Op-Amp 2"

came in at 650 V/µS with a power dissipation of 113 µW. In this case, the power dissipation for Two-Stage Op-Amp 2 is greater than both the originally optimized, power dissipation constrained Two-Stage Op-Amp 1 as well as the SR-Improved Op-Amp. Further, the slew rate for Two-Stage Op-Amp 2 is around one tenth of that of the SR-Improved Op-Amp embodiment in the present application.

Figure 4:
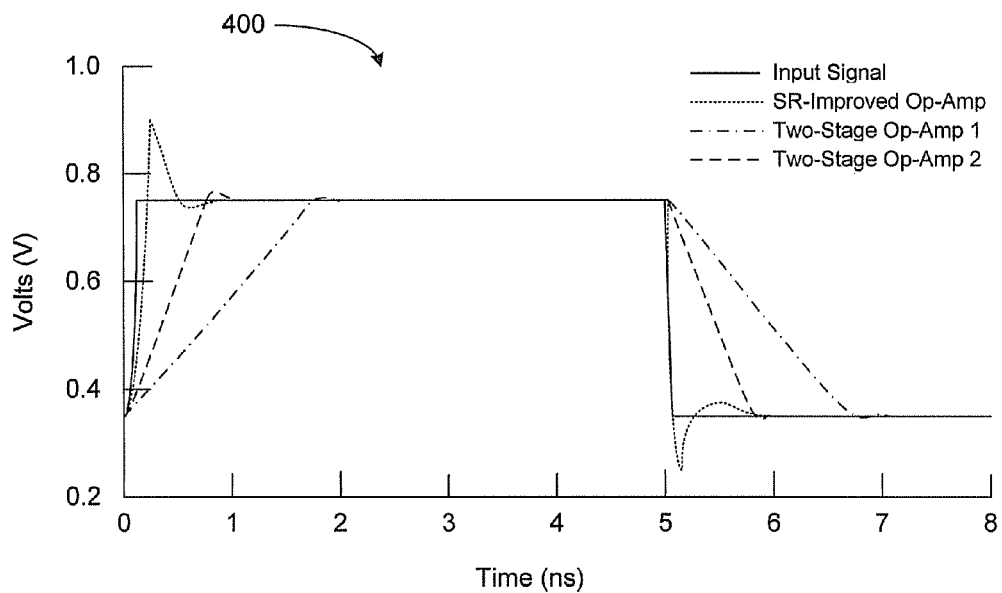
FIG. 4 is a graph comparing the transient responses of a first two-stage operational amplifier, a second two-stage operational amplifier and an operational amplifier circuit having improved slew rate embodiment of the present application.

FIG. 4 is a graph 400 comparing the transient responses of Two-Stage Op-Amp 1, Two-Stage Op-Amp 2 and the SR-Improved Op-Amp given an input signal with a rise time of 100 ps. As compared to the two two-stage operational amplifiers, the SR-Improved Op-Amp shows a noticeably high slew rate.

In addition to the slew rate, the settling time of the circuits are also compared. Settling time is measured as the time required for the output to reach and remain with 2% of its final value. Table 3 shows a comparison of the rising edge and falling edge settling times for the Two-Stage Op-Amp 1, the Two-Stage Op-Amp 2, and the SR-Improved Op-Amp, each with a load capacitance of 20 fF. In Table 3, settling time is provided in units of picoseconds (ps).

TABLE 3

|  | SR-Improved Op-amp | Two-stage Op-amp 1 | Two-stage Op-amp 2 |
| --- | --- | --- | --- |
| $t_{s,r}$ (ps) | 310 | 1490 | 620 |
| $t_{s,f}$ (ps) | 600 | 1610 | 660 |

As shown in Table 3, the rising edge settling time of SR-Improved Op-Amp is significantly smaller than those of the two two-stage operational amplifiers. On the other hand, the falling edge settling time of the slew SR-Improved Op-Amp is significantly smaller than the falling edge settling time of two-stage operational amplifier 1, but comparable to the falling edge settling time of two-stage operational amplifier 2. It should be noted that Two-Stage Op-Amp 2 was designed with no power constraints and consumes additional power in the interest of a better slew rate (113 µW vs 78 µW for the SR-Improved Op-Amp circuit).

To further improve the power efficiency, alternative embodiments of the slew rate improved operational amplifier may include multiple two-stage operational amplifiers sharing the same comparator circuits, thus reducing the increased power dissipation per additional operational amplifier in a circuit.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An operational amplifier circuit, comprising:
   an operational amplifier receiving a first voltage input and a second voltage input;
   a current booster circuit comprising a first current source, a second current source, a third current source, and a fourth current source;
   a first comparator having a non-inverting input, an inverting input and an output, the non-inverting input coupled to the first voltage input and the inverting input coupled to the second voltage input; and
   a second comparator having a non-inverting input, an inverting input and an output, the non-inverting input coupled to the second voltage input and the inverting input coupled to the first voltage input;
   wherein the outputs of the first and second comparators control the first, second, third and fourth current sources to supply additional current improving the slew rate of the operational amplifier circuit.

2. The operational amplifier circuit of claim 1, wherein the first comparator and the second comparator are implemented with transistors having different dimensions.

3. The operational amplifier circuit of claim 2, wherein the different dimensions comprise different channel lengths.

4. The operational amplifier circuit of claim 1, wherein the first comparator detects the onset of a positive slewing operation.

5. The operational amplifier circuit of claim 1, wherein the second comparator detects the onset of a negative slewing operation.

6. The operational amplifier circuit of claim 2, wherein the first and third current sources are activated when the onset of a positive slewing operation is detected by the first comparator.

7. The operational amplifier circuit of claim 2, wherein the onset of a positive slewing operation is detected when the difference between the first voltage input and the second voltage input is a positive value greater than a threshold voltage.

8. The operational amplifier circuit of claim 2, wherein the second and fourth current sources are activated when the onset of a negative slewing operation is detected by the second comparator.

9. The operational amplifier circuit of claim 2, wherein the onset of a negative slewing operation is detected when the difference between the first voltage input and the second voltage input is a negative value having an absolute value greater than a threshold voltage.

10. The operational amplifier circuit of claim 1, wherein the operational amplifier, first comparator and second comparator are implemented using Fin Field Effect Transistor (FinFET) devices.

11. A method for improving a slew rate of an operational amplifier, comprising:
    detecting the onset of a slewing operation with a comparator separate from the operational amplifier;
    activating at least two out of at least four additional current sources during the slewing operation to improve the slew rate in response to an output of the comparator; and
    deactivating the at least two out of the at least four additional current sources when no slewing operation is detected in response to a change in the output of the comparator, thereby minimizing additional power dissipation from additional current flow.

12. The method of claim 11, wherein detecting the onset of a slewing operation comprising comparing the difference between a first voltage and a second voltage at the input of the operational amplifier against a threshold value.

13. The method of claim 12, wherein the at least two of at least four additional current sources are activated depending on whether the detected slewing operation is positive or negative.

14. The method of claim 13, wherein the slewing operation is positive if the difference between the input voltages is positive and greater than switching threshold voltage of the comparator.

15. The method of claim 13, wherein the slewing operation is negative if the difference between the input voltages is negative and the absolute value of the difference is greater than the switching threshold voltages of a second comparator.

16. The method of claim 11, wherein the comparator comprises two input transistors, and wherein the two input transistors have different dimensions.

17. The method of claim 16, wherein the different dimensions comprise different channel lengths.

18. The method of claim 11, wherein the operational amplifier and the comparator are implemented using Fin Field Effect Transistor (FinFET) devices.

19. A slew rate improvement circuit for an operational amplifier, comprising:
    a current booster circuit comprising a first current source, a second current source, a third current source, and a fourth current source; and
    a comparator circuit comprising a first comparator and a second comparator, wherein the first comparator has a non-inverting input, an inverting input and an output, the non-inverting input coupled to a first voltage input and the inverting input coupled to a second voltage input, wherein the second comparator has a non-inverting input, an inverting input and an output, the non-inverting input coupled to the second voltage input and the inverting input coupled to the first voltage input; wherein the outputs of the first and second comparators control the first, second, third and fourth current sources to supply additional current improving the slew rate of the operational amplifier circuit.

20. The slew rate improvement circuit of claim 19, wherein the first voltage input and the second voltage input are voltage inputs to the operational amplifier.

* * * * *

UNITED STATES PATENT AND TRADEMARK OFFICE
CERTIFICATE OF CORRECTION

PATENT NO. : 8,089,314 B2  Page 1 of 1
APPLICATION NO. : 12/764294
DATED : January 3, 2012
INVENTOR(S) : Thakker et al.

It is certified that error appears in the above-identified patent and that said Letters Patent is hereby corrected as shown below:

On the title page, item (56), under "OTHER PUBLICATIONS", in Column 2, Line 2, delete "Semiconducor" and insert -- Semiconductor --, therefor.

On the title page, in the Figure, delete " " and insert -- 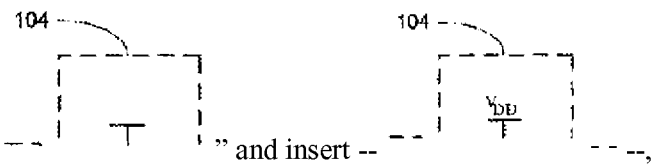 --, therefor.

In Fig. 1, Sheet 1 of 3, delete " " and insert -- 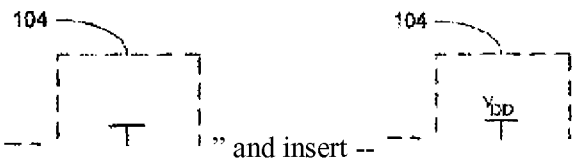 --, therefor.

In Column 4, Line 34, delete "V." and insert -- $V_{sw}$. --, therefor.

In Column 4, Line 60, delete "teiminal" and insert -- terminal --, therefor.

Signed and Sealed this
Nineteenth Day of June, 2012

David J. Kappos
*Director of the United States Patent and Trademark Office*